United States Patent
Pilat et al.

(10) Patent No.: US 8,519,531 B2
(45) Date of Patent: Aug. 27, 2013

(54) ELECTRICAL AND/OR ELECTRONIC DEVICE WITH ELASTIC CONTACT ELEMENT

(75) Inventors: Eric Pilat, Brison Saint Innocent (FR); Alexandre Vachez, Barberaz (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/514,399

(22) PCT Filed: Dec. 14, 2010

(86) PCT No.: PCT/EP2010/069627
§ 371 (c)(1),
(2), (4) Date: Jun. 7, 2012

(87) PCT Pub. No.: WO2011/073190
PCT Pub. Date: Jun. 23, 2011

(65) Prior Publication Data
US 2012/0248493 A1   Oct. 4, 2012

(30) Foreign Application Priority Data
Dec. 15, 2009 (FR) ...................................... 09 59001

(51) Int. Cl.
*H01L 23/043* (2006.01)
(52) U.S. Cl.
USPC ............. 257/709; 257/99; 257/433; 257/724; 257/E23.188; 438/117
(58) Field of Classification Search
USPC .................... 257/709, 99, 433, 724, E23.188; 438/117
See application file for complete search history.

(56) References Cited

U.S. PATENT DOCUMENTS

| 5,059,254 A | 10/1991 | Yaba et al. | |
| 7,999,277 B2 * | 8/2011 | Fushimi et al. | ................. 257/98 |

(Continued)

FOREIGN PATENT DOCUMENTS

| DE | 197 52 678 A1 | 6/1999 |
| EP | 0 343 628 A2 | 11/1989 |

(Continued)

OTHER PUBLICATIONS

French Preliminary Search Report Issued Apr. 30, 2010 in Paten Application No. 0959001 (with English translation of Categories of Cited Documents).

(Continued)

*Primary Examiner* — Tu-Tu Ho
(74) *Attorney, Agent, or Firm* — Oblon, Spivak, McClelland, Maier & Neustadt, L.L.P.

(57) ABSTRACT

An electrical and/or electronic device including: an electrical and/or electronic component; two layers of material forming front and back faces of the device and between which the electrical and/or electronic component is encapsulated, the component including at least two opposite faces placed facing the two layers of material; an electrical contact element placed in contact with one of the faces of the electrical and/or electronic component; an element based on at least one elastic material placed between one of the two layers of material and the electrical contact element, forming a first layer of elastic material covering the one of the two layers of material; and a second layer based on at least one elastic material with an elastic stiffness less than the stiffness of the elastic material in the first layer, placed in contact with the first layer of elastic material.

11 Claims, 4 Drawing Sheets

(56) References Cited

U.S. PATENT DOCUMENTS

2006/0272699 A1 12/2006 Lauvray et al.
2007/0074755 A1 4/2007 Eberspacher et al.
2008/0257401 A1 10/2008 Lauvray et al.
2010/0126560 A1 5/2010 Lauvray et al.

FOREIGN PATENT DOCUMENTS

| FR | 2 917 899 A1 | 12/2008 |
|---|---|---|
| WO | WO 03/038911 A1 | 5/2003 |
| WO | WO 2004/075246 A2 | 9/2004 |
| WO | WO 2004/095586 A2 | 11/2004 |
| WO | WO 2008/136872 A2 | 11/2008 |

OTHER PUBLICATIONS

International Search Report issued Jan. 27, 2011, in PCT/EP2010/069627.

\* cited by examiner

ELECTRICAL AND/OR ELECTRONIC DEVICE WITH ELASTIC CONTACT ELEMENT

TECHNICAL FIELD

The invention relates to the field of electrical and/or electronic devices comprising encapsulated electrical and/or electronic components. The invention is particularly applicable to devices comprising at least one transparent face through which electrical and/or electronic components can emit and/or receive a light flux.

The invention is particularly suitable for photovoltaic modules comprising encapsulated photovoltaic cells.

The invention also relates to the field of electrical and/or electronic devices comprising encapsulated optoelectronic components such as CCD (Charge Coupled Device) type sensors, or CMOS, or the field of flat screens, for example LCD (Liquid Crystal Display), or plasma or LED (Light Emitting Diode) type screens.

STATE OF PRIOR ART

A photovoltaic module is an assembly of photovoltaic cells placed side by side between a first transparent layer, for example based on glass, forming a front face of the photovoltaic module and a second layer that may also be transparent and based on glass, metal or plastic, and forming a back face of the photovoltaic module.

The photovoltaic cells are electrically connected together in series by front and back electrical contact elements called connecting conductors and for example formed by copper strips, placed in contact with the front face (facing the front face of the photovoltaic module which will receive the light flux) and the back face (facing the back face of the photovoltaic module) of each photovoltaic cell.

In order that the photovoltaic module forms a rigid assembly, it comprises a frame surrounding a set of laminated layers inside which the photovoltaic cells are arranged.

This assembly may include two ethylene vinyl acetate (EVA) layers between which the photovoltaic cells and cell connecting conductors are located, with a glass layer superposed on the EVA layer facing the front faces of the photovoltaic cells, and a layer based on glass or a composite material such as a laminate based on polyvinyl fluoride (PVF) or a polyethylene terephthalate (PET) placed in contact with the other EVA layer facing the back faces of the photovoltaic cells.

The major disadvantage of this encapsulation of the photovoltaic cells to form the photovoltaic module is that it is expensive, the techniques used to make this encapsulation representing about 30% of the total cost of the photovoltaic module.

In order to reduce the cost of this encapsulation, document WO 03/038911 A1 discloses a photovoltaic module made by encapsulating photovoltaic cells between two glass based substrates, the photovoltaic cells being arranged in a sealed inside volume formed by depressurisation between the two glass substrates and delimited laterally by a peripheral seal.

Although the photovoltaic cells in such a module reduce the cost related to encapsulation, they usually crack after the photovoltaic module has been subjected to a few thermal cycles.

Temperature variations, for example between about −40° C. and +85° C., generate pressure variations inside the internal volume in which the cells are encapsulated, which generates stresses on the photovoltaic cells.

These stresses are particularly high when surface irregularities (of glass substrates) inside the volume are high. Such cracks inside a photovoltaic cell can separate and isolate part of the cell from the electrical contacts of the cell as soon as they are formed or later during the life of the cell, possibly causing loss of some of the electricity produced by the cell.

The problems mentioned above for photovoltaic modules also occur in other types of electrical and/or electronic devices and particularly in optoelectronic devices such as imaging devices (CCD, CMOS, etc.) or electronic display type devices (LCD, plasma, LED, etc.) comprising encapsulated components, and in which an attempt is made to obtain good electrical contact with the component(s) of the device despite irregularities in the surface of the layers between which the component(s) is (are) encapsulated.

PRESENTATION OF THE INVENTION

One purpose of this invention is to disclose an electrical and/or electronic device comprising one or more encapsulated electrical and/or electronic components that does not have the disadvantages of devices according to prior art, in other words that is inexpensive to make, that does not deteriorate when several temperature variation cycles are applied to it and that can give good electrical contact of the component(s) of the device regardless of the surface irregularities of the layers between which the component(s) is (are) encapsulated.

For this purpose, it is proposed an electrical and/or electronic device comprising at least:

an electrical and/or electronic component,
two layers of material forming the front and back faces of the device and between which the electrical and/or electronic component is encapsulated, the electrical and/or electronic component comprising at least two opposite faces such that each of said two opposite faces is placed facing one of the two layers of material,
an electrical contact element placed in contact with at least one of said two opposite faces of the electrical and/or electronic component,
an element based on at least one elastic material placed between one of the two layers of material and the electrical contact element.

The element(s) based on the elastic material can apply a pressure between the electrical contact element and the electrical and/or electronic component generated by compression of the element(s) based on the elastic material. For example, this compression may be due to a vacuum pressure occurring in the volume inside which the electrical and/or electronic component is encapsulated and/or induced by a mechanical force applied on the front face or the back face of the device.

The element(s) based on the elastic material give good electrical contact between the electrical contact element(s) and the electrical and/or electronic component(s) as a result of the pressure applied between the electrical contact element(s) and the electrical and/or electronic component(s), through the compressed element(s) based on the elastic material, thus compensating the stress variations that may be applied to the electrical and/or electronic components, for example due to possible surface irregularities in the layers forming the front and back faces of the device and/or pressure variations inside the device (particularly in the case of onboard modules in mobile applications or simply due to transport of the device).

Furthermore, considering that the electrical and/or electronic component(s) or the electrical contact element(s) may penetrate more or less in the element(s) based on elastic material, this or these element(s) based on an elastic material can compensate for any defect in the planeness and/or parallelism of the two layers forming the front and back faces of the device and between which the electrical and/or electronic component(s) is (are) encapsulated.

In the invention, the electrical and/or electronic component(s) is (are) encapsulated between the layers of material forming the front and back faces of the device. The term "encapsulated" means that the electrical and/or electronic component(s) is (are) placed in a volume, for example a hermetically closed volume, at least partly formed by the two layers of material.

It is also proposed an electrical and/or electronic device comprising at least:
- an electrical and/or electronic component,
- two layers of material forming the front and back faces of the device and between which the electrical and/or electronic component is encapsulated, the electrical and/or electronic component comprising at least two opposite faces such that each of said two opposite faces is placed facing one of the two layers of material,
- an electrical contact element placed in contact with at least one of said two opposite faces of the electrical and/or electronic component,
- an element based on at least one elastic material placed between one of the two layers of material and the electrical contact element, forming a first layer of elastic material at least partially covering said one of the two layers of material,
- a second layer based on at least one elastic material with an elastic stiffness less than the stiffness of the elastic material in the first layer, placed in contact with the first layer of elastic material and between said one of the two layers of material and the electrical contact element.

The element based on the elastic material may also be placed between one of the two layers of material and the electrical and/or electronic component.

The device may comprise a plurality of electrical contact elements such that each of the two opposite faces of the electrical and/or electronic component comprises at least one of the electrical contact elements placed in contact with said each of the two opposite faces of the electrical and/or electronic component.

The layer of material forming the front face of the device may be transparent, the electrical and/or electronic component may be capable of emitting and/or receiving at least one light flux through the front face of the device.

The term "transparent" means that the material in the layer forming the front face of the device is at least partially transparent to visible light, allowing at least about 80% of this light to pass through.

In one particular embodiment, the element based on the elastic material may form a layer of elastic material at least partially covering one of the two layers of material.

In this case, the device may also comprise a second layer based on at least one elastic material, placed in contact with the other layer of elastic material and between one of the two layers of material and the electrical contact element.

In this case, the two layers based on elastic material can cooperate with each other to make contact between the electrical contact element and the electrical and/or electronic component through the application of a pressure between the electrical contact element and the electrical and/or electronic component generated by compression of the two layers based on an elastic material.

The electrical and/or electronic component may be in contact with the second layer of elastic material.

In another embodiment, the device may comprise:
- a plurality of electrical contact elements placed in contact with at least one of the two opposite faces of the electrical and/or electronic component,
- a plurality of elements based on elastic material placed between one of the two layers of material and said electrical contact elements.

In this case, the device may also comprise at least one portion of at least one elastic material placed adjacent to the electrical contact elements, between one of the two layers of material and the electrical and/or electronic component, and in contact with one of the two layers of material and said electrical and/or electronic component.

Each of the elements based on an elastic material may comprise a recess in which one of the electrical contact elements is placed, thus facilitating positioning of elements based on an elastic material relative to the electrical contact elements.

The element(s) based on an elastic material located on the side of the front face of the device may be at least 80% transparent to wavelengths between about 300 nm and 1200 nm, and/or the elements based on an elastic material located on the side of the back face of the device may be at least 80% transparent to wavelengths more than about 1200 nm and/or have an optical reflection of at least 80% for wavelengths of between about 300 nm and 1200 nm.

An "elastic material" is a material with an elastic deformation within a certain range of stresses.

The elastic material(s) may be based on at least materials chosen from among polymers, silicone, rubber, polyurethane, elastomer, or a material for which the creep strain is less than about 10%, and/or also comprising an adhesive property.

At least the electrical and/or electronic component, the electrical contact element(s) and the element(s) based on an elastic material may be placed in a closed, hermetically sealed, depressurised volume formed between said two layers of material.

The device may comprise:
- a plurality of electrical and/or electronic components that are photovoltaic cells,
- a plurality of electrical contact elements comprising strips of electrically conducting material placed in contact with the photovoltaic cells and electrically connecting the photovoltaic cells to each other, the device possibly being a photovoltaic module.

The electrical and/or electronic component may be an electronic image sensor or an electronic display element.

It also discloses a method for making an electrical and/or electronic device comprising at least the following steps:
- making of at least one electrical and/or electronic component comprising at least two opposite faces and of at least one electrical contact element placed in contact with at least one of said two opposite faces of the electrical and/or electronic component,
- making of at least one element based on at least one elastic material in contact with a layer of material intended to form a front or back face of the device,
- encapsulation of the electrical and/or electronic component between two layers of material forming the front and the back faces of the device, each of the two opposite faces of the electrical and/or electronic component being placed facing one of the two layers of material.

The element based on the elastic material may be put in compression such that it generates pressure between the electrical contact element and the electrical and/or electronic component.

The invention also discloses a method for making an electrical and/or electronic device comprising at least the following steps:
- making of at least one electrical and/or electronic component comprising at least two opposite faces and of at least one electrical contact element placed in contact with at least one of said two opposite faces of the electrical and/or electronic component,
- making of at least one element based on at least one elastic material in contact with a layer of material intended to form a front or back face of the device, forming a first layer of elastic material at least partially covering said layer of material, and of at least a second layer based on at least one elastic material with an elastic stiffness less than the stiffness of the elastic material of the first layer, placed in contact with the first layer of elastic material,
- encapsulation of the electrical and/or electronic component between two layers of material forming the front and back faces of the device, each of the two opposite faces of the electrical and/or electronic component being placed facing one of the two layers of material.

BRIEF DESCRIPTION OF THE DRAWING

This invention will be better understood after reading the description of example embodiments given for purely informative purposes and in no way limitative with reference to the appended drawings in which.

Identical, similar or equivalent parts of the different figures described below have the same numeric references to facilitate comparison between different figures.

The different parts shown in the figures are not necessarily all shown at the same scale to make the figures more easily understandable.

The different possibilities (variants and embodiments) must be understood as being not mutually exclusive and they may be combined with each other.

DETAILED PRESENTATION OF PARTICULAR EMBODIMENTS

Figure 1:
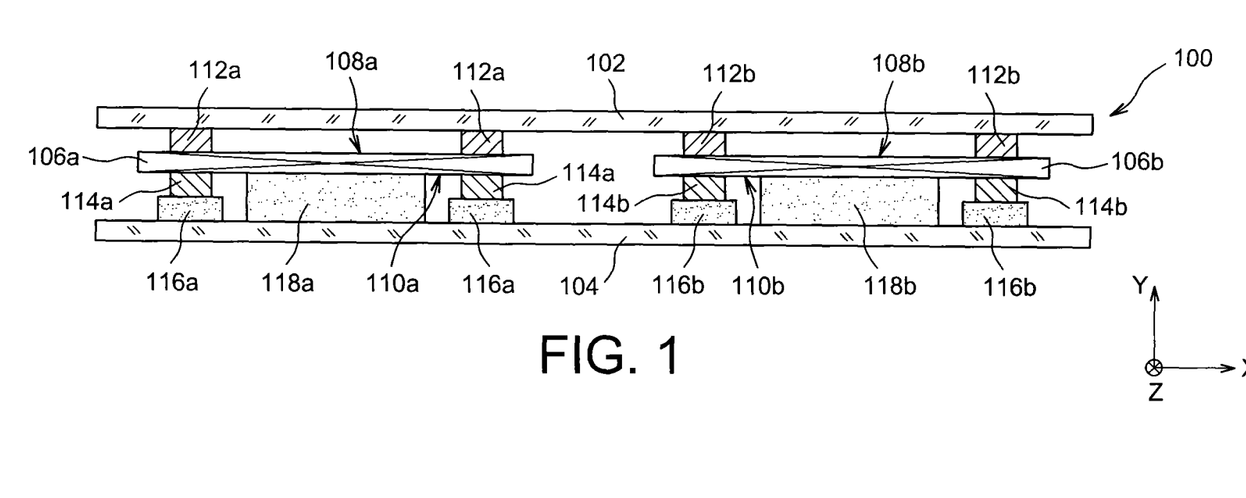
FIG. 1 shows a photovoltaic module according to a first embodiment.

Firstly refer to FIG. 1 that shows an electrical device 100, in this case a photovoltaic module according to a first embodiment.

The photovoltaic module 100 comprises two layers 102 and 104, for example based on glass and forming the front and back faces respectively of the photovoltaic module 100.

The photovoltaic module 100 comprises a plurality of photovoltaic cells electrically connected to each other through electrical contact elements.

Only two photovoltaic cells 106a, 106b are shown in FIG. 1. Each of the photovoltaic cells 106a, 106b comprises a first face 108a, 108b placed facing the layer 102 forming the front face of the photovoltaic module 100 and a second face 110a, 110b, opposite the first face 108a, 108b and placed facing the layer 104 forming the back face of the photovoltaic module 100.

The electrical contact elements connecting the photovoltaic cells 106a, 106b to each other and for example formed by strips based on one or several electrically conducting materials such as copper, are placed in contact with the front faces 108a, 108b and the back faces 110a, 110b of the photovoltaic cells 106a, 106b.

In the example shown in FIG. 1, electrical contact elements 112a and 114a are placed in contact with the front face 108a and the back face 110a respectively of the photovoltaic cell 106a. Similarly, the electrical contact elements 112b and 114b are placed in contact with the front face 108b and the back face 110b respectively of the photovoltaic cell 106b.

In the photovoltaic module 100, the layer 102 forming the front face of the module 100 is placed directly in contact with the electrical contact elements 112a, 112b facing the front faces 108a, 108b of the photovoltaic cells 106a, 106b.

The photovoltaic module 100 also comprises elements 116a and 116b based on an elastic material placed between the electrical contact elements 114a, 114b and the layer 104 forming the back face of the photovoltaic module 100. The photovoltaic module 100 also comprises portions 118a, 118b based on an elastic material placed between the photovoltaic cells 106a, 106b and the layer 104 forming the back face of the photovoltaic module 100. The thickness of the portions 118a, 118b (the dimension along the y axis shown in FIG. 1) is greater than the thickness of the elements 116a, 116b because these portions 118a, 118b are placed between the electrical contact elements 114a, 114b of each of the photovoltaic cells 106a, 106b.

In the example shown in FIG. 1, the thickness of each of the portions 118a, 118b is approximately equal to the sum of the thicknesses of one of the elastic elements 116a, 116b and one of the electrical contact elements 114a, 114b. In this case, the elements 116a, 116b and the portions 118a, 118b are based on polymer, for example elastomer.

Considering that the elements 116a, 116b based on an elastic material are in compression, the pressure generated by this compression guarantees good electrical contact between the photovoltaic cells 106a, 106b and the electrical contact elements 112a, 112b, 114a, 114b.

The material forming the elastic elements 116a, 116b and the portions 118a, 118b may be chosen such that for a crush equal to about 50 μm, this material returns a pressure equal to at least 0.3 MPa, and/or for a crush equal to about 150 μm, this material returns a pressure of less than or equal to about 1 MPa.

Respecting these stresses corresponds to a material for which the stiffness constant and the coefficient of viscosity give it a strain curve in compression less than 7 MPa/mm within this crush range (between about 50 μm and 150 μm).

Although it cannot be seen in FIG. 1, the photovoltaic cells 106a, 106b, the electrical contact elements 112a, 112b, 114a, 114b and the elements made of an elastic material 116a, 116b, 118a, 118b are located in a sealed inside volume formed between the layers 102 and 104 of the photovoltaic module 100, the photovoltaic cells 106a, 106b thus being encapsulated between layers 102 and 104.

For a temperature equal to about 85° C., the absolute internal pressure inside this volume may be greater than or equal to about 800 mbars (which is equal to about −200 mbars less than atmospheric pressure).

Elements 116a, 116b and portions 118a, 118b based on the elastic material also compensate for planeness defects in the layers 102 and 104 forming the front and back faces of the photovoltaic module 100, and can therefore give good electrical contact between the electrical contact elements 114a, 114b and faces 110a, 110b of the photovoltaic cells 106a, 106b located on the side of the back face of the photovoltaic module 100, and between the electrical contact elements 112a, 112b and faces 108a, 108b of the photovoltaic cells 106a, 106b located on the side of the front face of the photovoltaic module 100.

This compensation means that making the pressure inside the sealed volume in which the elements of the module 100 are located vary, there will always be an electrical contact between the electrical contact elements 114a, 114b and the faces 110a, 110b of the photovoltaic cells 106a, 106b and between the electrical contact elements 112a, 112b and the faces 108a, 108b of the photovoltaic cells 106a, 106b, particularly when the temperature of the photovoltaic module 100 varies. Furthermore, this compensation can also prevent the formation of cracks in the photovoltaic cells 106a, 106b after several thermal cycles have been applied to the module 100. The thickest portions 118a, 118b can also support photovoltaic cells 106a, 106b and attenuate the effects of deformation by bending of the cells 106a, 106b that can occur when stresses like those generated by temperature variations are applied to the photovoltaic cells 106a, 106b.

Figure 2A:
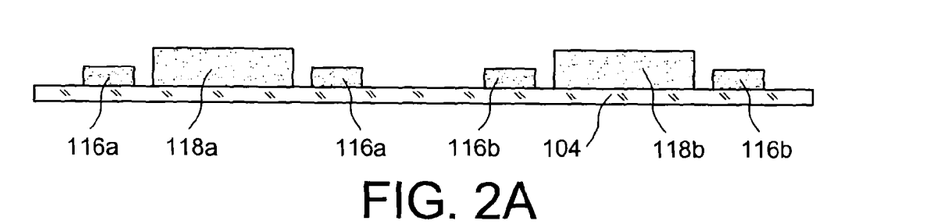
FIGS. 2A to 2C show steps of a method for making the photovoltaic module according to the first embodiment.
Figure 2B:
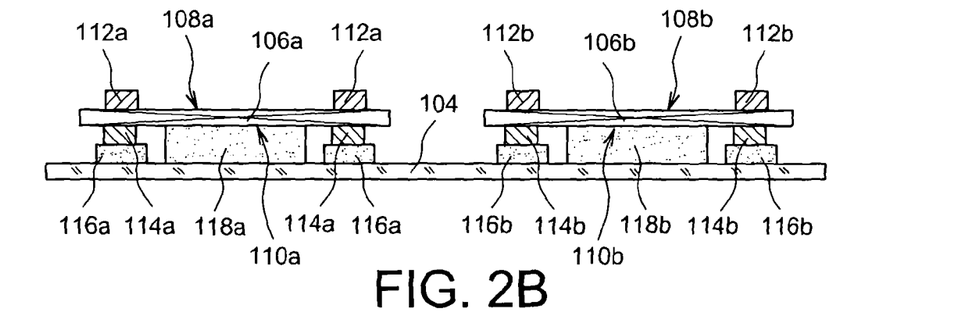
Figure 2C:
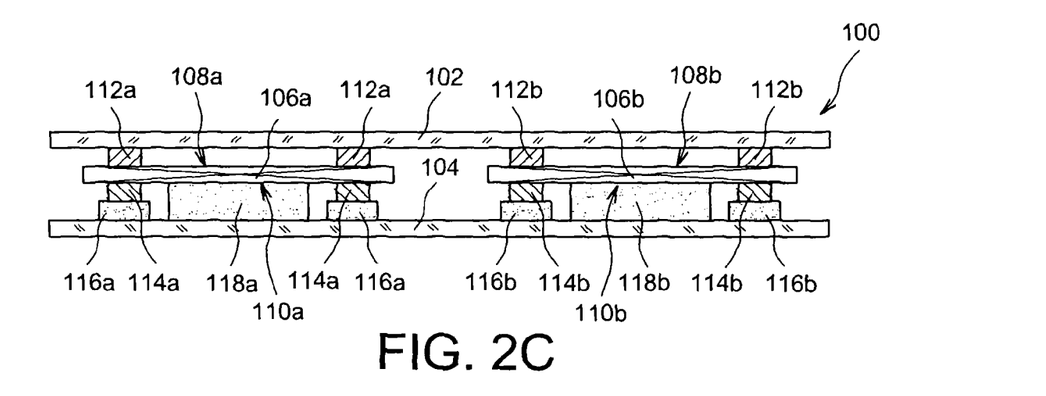

Refer to FIGS. 2A to 2C that show steps in a method for making the photovoltaic module 100.

As shown in FIG. 2A, the first step is to make the elements 116a, 116b and portions 118a, 118b based on polymer, for example using dispensing nozzles or screen printing, on the layer 104 intended to form the back face of the photovoltaic cell 100.

At the same time, the photovoltaic cells 106a, 106b are made and the electrical contact elements 112a, 112b, 114a, 114b are formed in contact with the photovoltaic cells 106a, 106b in a conventional manner.

The photovoltaic cells 106a, 106b and the electrical contact elements 112a, 112b, 114a, 114b are then placed in contact with the elements 116a, 116b and the portions 118a, 118b based on an elastic material (FIG. 2B).

Finally, as shown in FIG. 2C, the photovoltaic module 100 is closed by placing the glass layer 102 forming the front face of the photovoltaic module 100 in contact with the electrical contacts 112a, 112b. During this closure or encapsulation, the photovoltaic cells 106a, 106b and their electrical contacts 114a, 114b are pressed in contact with the elements and portions of elastomer 116a, 116b, 118a, 118b and penetrate more or less into these elements and portions of elastomer 116a, 116b, 118a, 118b depending on the variations and/or defects in planeness and/or parallelism between the two layers 102 and 104 forming the front and back faces of the photovoltaic module 100.

In this example manufacturing method, the photovoltaic module 100 is closed in a depressurised environment. The value of the vacuum pressure depends on the temperature at which this closure is done: the pressure may for example be less than or equal to about −300 mbars (value relative to atmospheric pressure) when the temperature is equal to about 20° C., or less than or equal to about −100 mbars (value relative to atmospheric pressure) when the temperature is equal to about 90° C.

This vacuum pressure enables that elements of the photovoltaic module 100 can be kept straight, preventing any risks of bending (bulging) in the layers 102 and 104 forming the front and back faces of the photovoltaic module 100 (layers bulging towards the outside of the module 100) when they are exposed to high temperatures or low pressures (for example when the module is used at high altitudes).

During the closing step of the module 100, a spacer can be used placed around the cells 106a, 106b in order to limit the movement of the press bringing the layer 102 onto the electrical contact elements 112a, 112b, thus guaranteeing a satisfactory distance between the layers 102 and 104. For example this distance D may be calculated such that:

$$D = E_{contact} + E_{cell} + E_{elastomer1} - D_{planeness}$$

where:

$E_{contact}$: thickness of one of the electrical contact elements 112a, 112b, 114a, 114b;

$E_{cell}$: thickness of one of the photovoltaic cells 106a, 106b;

$E_{elastomer1}$: thickness of one of the elastomer portions 118a, 118b;

$D_{planeness}$: planeness defects in glass layers 102, 104 (usually equal to not more than about 100 μm).

This distance D may also be written in the following form:

$$D = 2 \cdot E_{contact} + E_{cell} + E_{elastomer2} - D_{planeness}$$

where $E_{elastomer2}$: thickness of one of the elastomer elements 116a, 116b.

All the thicknesses mentioned above correspond to the dimensions of the elements along the y axis as shown in FIG. 1.

Respecting this distance D also assures good electrical contact on all photovoltaic cells after depressurisation in the photovoltaic module 100.

Figure 3:
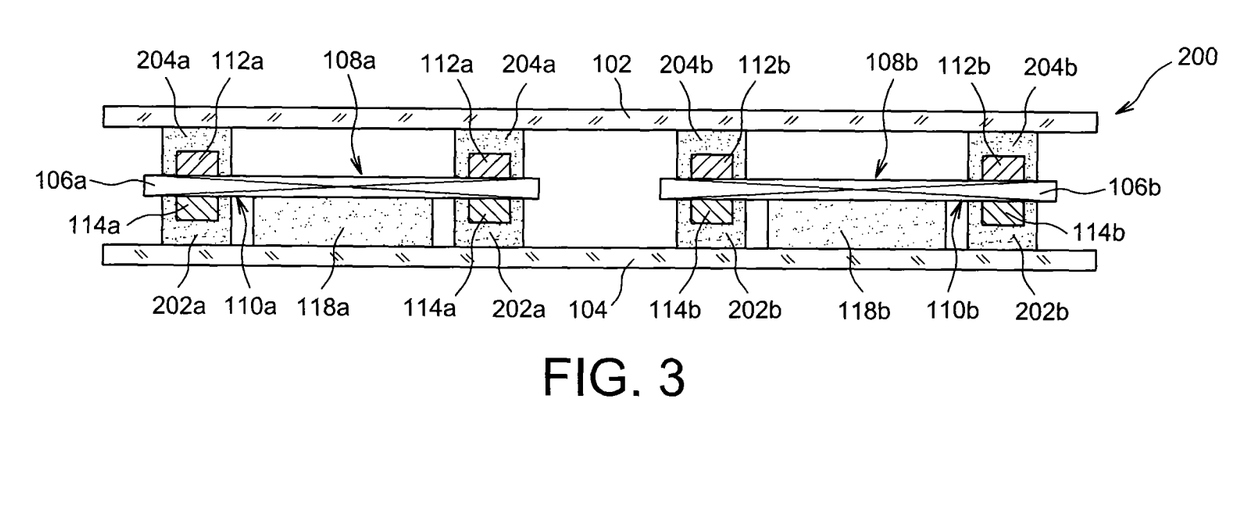
FIGS. 3 to 5 show photovoltaic modules according to second, third and fourth embodiments respectively.

Now refer to FIG. 3 that shows a photovoltaic module 200 according to a second embodiment.

In a similar manner to the photovoltaic module 100 described above with reference to FIG. 1, the photovoltaic module 200 comprises two glass layers 102 and 104 forming the front and back faces of the photovoltaic module 200, the photovoltaic cells 106a, 106b, the electrical contact elements 112a, 112b, 114a, 114b, and the portions made of an elastic material 118a, 118b.

The photovoltaic module 200 also comprises elements 202a, 202b based on an elastic material, for example elastomer, placed between the electrical contact elements 114a, 114b and the layer 104 forming the back face of the photovoltaic module 200.

These elements 202a, 202b perform exactly the same role as the elements 116a, 116b of the photovoltaic module 100, namely they give good electrical contact between the electrical contact elements 114a, 114b and the photovoltaic cells 106a, 106b, compensate for planeness defects of the layers 102 and 104 and thus prevent the formation of cracks in the photovoltaic cells 106a, 106b after a few thermal cycles.

The characteristics of the material from which the elements 202a and 202b are made may be similar to the characteristics of the material from which the elements 116a, 116b are made.

However, unlike the elements 116a, 116b of the photovoltaic module 100, the elements 202a, 202b are "U"-shaped, in other words each comprises a recess inside which one of the electrical contact elements 112a, 112b is placed.

This special shape of the elastic elements 202a, 202b can facilitate positioning of these elements relative to the electrical contact elements 114a, 114b while supporting the photovoltaic cells 106a, 106b.

Furthermore, unlike the photovoltaic module 100, the photovoltaic module 200 comprises second elements 204a, 204b based on an elastic material, for example similar to the elements 202a, 202b, placed between each of the electrical contact elements 112a, 112b and the layer 102 forming the front face of the photovoltaic module 200.

Furthermore, in a similar manner to the elastic elements 202a, 202b, each of these elements 204a, 204b comprises a recess inside which one of the electrical contact elements 112a, 112b, is located in order to facilitate positioning of these elements relative to the electrical contact elements 112a, 112b.

These elements 204a, 204b cooperate with the other elements 202a, 202b based on an elastic material to give good electrical contact between the electrical contact elements 112a, 112b, 114a, 114b and the photovoltaic cells 106a, 106b, to compensate planeness defects of the layers 102, 104 forming the front and back faces of the photovoltaic module 200 and thus prevent the formation of cracks in photovoltaic cells 106a, 106b after a few thermal cycles applied to the photovoltaic module 200.

The method used to make the photovoltaic module 200 is similar to the method for making the photovoltaic module 100 described above, except that the elements 204a, 204b based on an elastic material are made in advance in contact with the layer 102 intended to form the front face of the photovoltaic module 200.

The photovoltaic module 200 is then closed by arranging the electrical contact elements 114a, 114b in the recesses of the elastic elements 202a, 202b and the electrical contact elements 112a, 112b in the recesses of the elastic elements 204a, 204b.

In one variant embodiment of the photovoltaic module 200, the portions based on an elastic material similar to portions 118a, 118b may be placed above the photovoltaic cells 106a, 106b, in other words between the photovoltaic cells 106a, 106b and the layer 102 forming the front face of the photovoltaic module 200, between the electrical contact elements 112a, 112b of each of the cells 106a, 106b.

Figure 4:
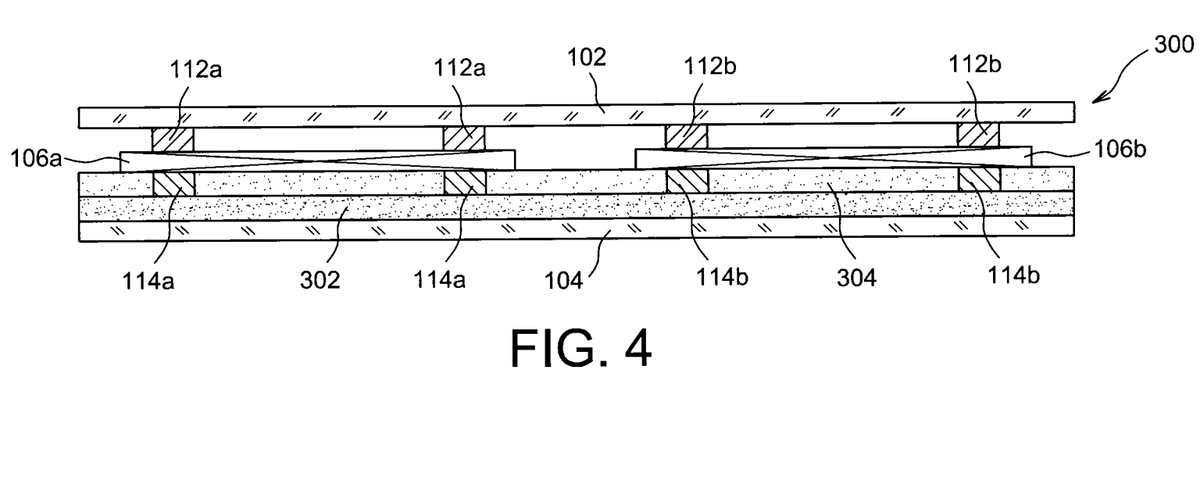

Now refer to FIG. 4 that shows a photovoltaic module 300 according to a third embodiment.

In the same way as the photovoltaic modules 100 and 200 described above with reference to FIGS. 1 and 3, the photovoltaic module 300 comprises two glass layers 102 and 104, the photovoltaic cells 106a, 106b and the electrical contact elements 112a, 112b, 114a, 114b.

The photovoltaic module 300 also comprises a layer 302 based on an elastic material, for example similar to the material forming the elements 116a, 116a, 202a, 202b, 204a, 204b and/or the portions 118a, 118b of the photovoltaic modules 100 and 200. This layer 302 covers the layer 104 forming the back face of the photovoltaic module 300.

The photovoltaic module 300 also comprises a second layer 304 based on an elastic material placed between the electrical contact elements 114a, 114b and the first elastic layer 302.

In the same way as the elastic elements 116a, 116b, 202a, 202b and the portions 118a, 118b of the photovoltaic modules 100 and 200, these layers 302 and 304 guarantee good electrical contact between the electrical contact elements 112a, 112b, 114a, 114b and the photovoltaic cells 106a, 106b, and compensate for planeness defects in layers 102, 104 forming the front and back faces of the photovoltaic module 300 and thus prevent the formation of cracks in the photovoltaic cells 106a, 106b after a few thermal cycles applied to the photovoltaic module 200. In the example shown in FIG. 4, it can be seen that the electrical contact elements 114a, 114b penetrate into the second elastic layer 304 such that the photovoltaic cells 106a, 106b are also supported on the second elastic layer 304. The second elastic layer 304 thus supports the photovoltaic cells 106a, 106b and can attenuate the effects of the bending deformation of cells 106a, 106, that can occur during thermal cycles applied to the photovoltaic module 300.

The elastic stiffness of the material in layer 302 may be sufficient to guarantee electrical contacts. This elastic stiffness may also be greater than the elastic stiffness of the material in the layer 304, which can limit buckling of cells 106a, 106b.

The material in the second layer 304 is chosen to be sufficiently electrically insulating (for example electrical resistivity more than about 2E15 $\Omega$·cm) so as not to short circuit the photovoltaic cells 106a, 106b between each other.

The elastic material(s) used to make the layers 302 and 304 may be of a silicone elastomer gel type, or EPDM (Ethylene-Propylene-Diene Monomer) rubber, polyurethane, or an elastomer foam made of any type of sufficiently flexible and visco-elastic polymer, in other words for example with a deformation of the order of one millimeter when the photovoltaic module 300 is subjected to a temperature variation between about −40° C. and +90° C.

The layers 302 and 304 may be in the form of prefabricated elastic films stacked on the layer 104 or they may be made by direct viscous phase depositions onto the layer 104 by a large area deposition method, for example by using the Doctor Blade method.

Figure 5:
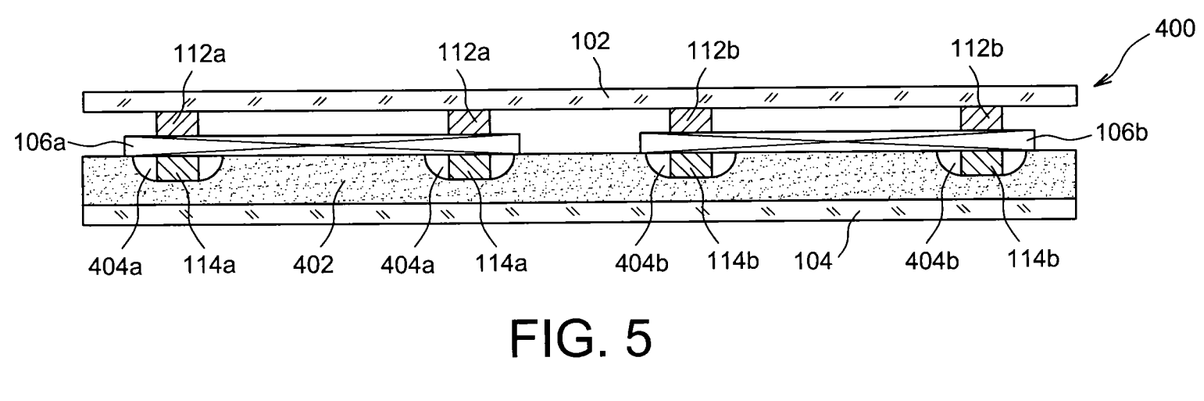

Refer to FIG. 5 that shows a photovoltaic module 400 according to a fourth embodiment.

Unlike the photovoltaic module 300, the photovoltaic module 400 comprises a single layer 402 based on an elastic material placed on the layer 104 forming the back face of the module 400 and on which the photovoltaic cells 106a, 106b and the electrical contact elements 114a, 114b are supported.

In penetrating into the layer 402, the electrical contact elements 114a, 114b form recesses 404a, 404b in the layer 402. The material from which the layer 402 is made may be similar to the material used in the layers 302 and 304 described above, and in particular may be sufficiently electrically insulating to not short circuit the photovoltaic cells 106a, 106b between each other. The layer 402 may be made by the use of techniques similar to those described above to make the layer 302.

In this fourth embodiment, the layer 402 can be made independently of the support formed by the layer 104, in the form of a film. Thus, this film may be applied on the support only at the time of assembly of the module 400.

In all the embodiments described above with reference to FIGS. 1 to 5, the thicknesses of the elements based on elastic material are adapted as a function of the rheological characteristics of the elastic materials used. For example, when the elements 116a, 116b of the photovoltaic module 100 and elements 202a, 202b of the photovoltaic module 200 are made based on a silicone gel with Shore OO hardness equal to about 45, these elements may be about 0.5 mm thick. In the photovoltaic module 300, the layer 302 may be a TPU (tetra polyurethane) based film with a Shore OO hardness equal to about 80 and about 0.5 mm thick, and the second layer 304 may be based on a EPDM rubber with a Shore OO hardness equal to about 45 and about 0.2 mm thick. In the photovoltaic module 400, the layer 402 may be a TPU film with a Shore OO hardness equal to about 45 and a thickness equal to about 45.

The elastic element(s) of the above modules could be made choosing one or several elastic materials with the following rheological characteristics:
  hardness: Shore 00<45 or Shore A<5 measured according to ISO standard 2039-2,
  creep strain less than about 10% measured according to ISO standard 10066,
  bulk resistivity >2E15 $\Omega$·cm (presenting a resistance to electrical breakdown conforming with IEC standard 61215 for a maximum thickness of about 1 mm);

working temperature: between −40° C. and +85° C., with intermittent operation at a temperature of +100° C.

It would also be possible that the elastic materials used would have an adhesive nature in order to improve the assembly of the elements of photovoltaic modules 100 to 400, particularly between the elastic materials and the electrical contact elements.

Furthermore, in all the embodiments described above, it is possible to make the elastic elements that are on the front face of the photovoltaic module from materials transparent at least to wavelengths between about 300 nm and 1200 nm. Thus, the elastic elements present on the front face of the photovoltaic module do not prevent light rays passing through the front face of the photovoltaic module from reaching the photovoltaic cells 106a, 106b.

Light absorption of the photovoltaic cells is then quite similar to a photovoltaic module that does not comprise any elastic materials on the front face of the photovoltaic module.

The elastic elements located on the same side as the back face of the photovoltaic module may be made from materials transparent to wavelengths longer than about 1200 nm and/or with an optical reflection to wavelengths of between about 300 nm and 1200 nm. Thus, light rays reaching these elements without being absorbed by the cells can be reflected towards photovoltaic cells in the module, thus improving the photovoltaic conversion efficiency of the module.

The technical effects obtained due to the use of one or several elements based on an elastic material previously described for photovoltaic modules may also be applied to other types of electrical and/or electronic devices comprising electrical and/or electronic components encapsulated between two layers forming the front and back faces of the device, particularly when the components are optical components such as CCD, CMOS type components, or when the device is a flat screen, for example an LCD, plasma or LED screen.

Figure 6:
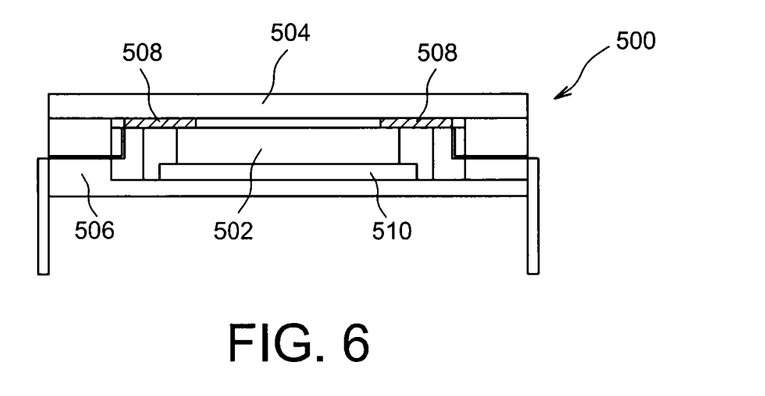
FIG. 6 shows a sensor type electronic device according to a particular embodiment.

FIG. 6 shows one example of such a device of the CCD/CMOS 500 sensor type.

The device 500 comprises a sensor 502 encapsulated between a layer 504 forming the front face of the device 500 and a layer 506 forming the back face of the device 500.

The sensor 502 is electrically connected to electrical contacts 508 of the flat film connections type placed between the upper layer 504 and the sensor 502, at the periphery of the sensor 502. The device 500 also comprises an element 510 based on an elastic material placed between the sensor 502 and the lower layer 506, forming an elastic layer supporting the sensor 502 while giving good electrical contact between the sensor 502 and the contacts 508.

This layer 510 can also compensate for planeness and/or parallelism defects of layers 504 and 506 of the device 500.

Figure 7:
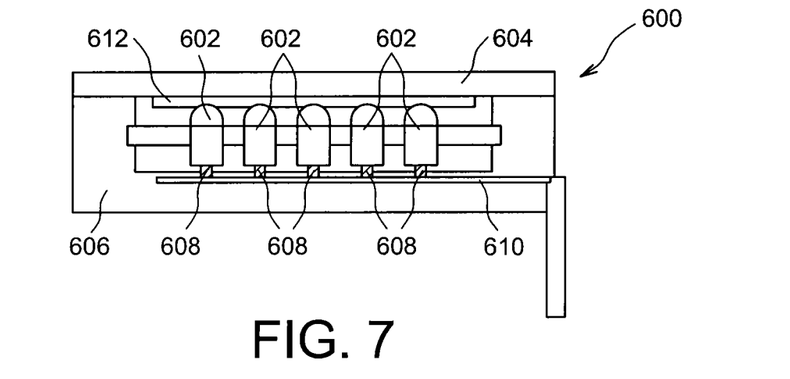
FIG. 7 shows a display type electronic device according to a particular embodiment.

Another LED display type device 600 is shown in FIG. 7.

This device 600 comprises a plurality of LEDs 602 arranged and encapsulated between an upper layer 604 forming the front face of the device 600 and a lower layer 606 forming the back face of the device 600.

Each LED 602 is electrically connected to an electrical contact 608, each electrical contact 608 being in contact with a connection element 610, for example a printed circuit.

The electrical contact between LEDs 602 and the printed circuit 610 through the electrical contacts 608 is obtained by pressure between these elements.

To achieve this, the device 600 comprises an element 612 based on an elastic material forming a layer, placed between the LEDs 602 and the upper layer 604 that provides this electrical contact by pressure between the LEDs 602 and the printed circuit 610 through electrical contacts 608 generated by compression of this element 612 obtained after placing the upper layer 604 on the LEDs 602 and closing the device 600.

The invention claimed is:

1. An electrical and/or electronic device comprising:
an electrical and/or electronic component;
two layers of material forming front and back faces of the device and between which the electrical and/or electronic component is encapsulated, the electrical and/or electronic component comprising at least two opposite faces such that each of the two opposite faces is placed facing one of the two layers of material;
an electrical contact element placed in contact with at least one of the two opposite faces of the electrical and/or electronic component;
an element based on at least one elastic material placed between one of the two layers of material and the electrical contact element, forming a first layer of elastic material at least partially covering the one of the two layers of material;
a second layer based on at least one elastic material with an elastic stiffness less than a stiffness of the elastic material in the first layer, placed in contact with the first layer of elastic material and between the one of the two layers of material and the electrical contact element; and
in which Shore A hardness of the elastic materials of the element and of the second layer is <5.

2. The device according to claim 1, in which the element based on the elastic material is also arranged between one of the two layers of material and the electrical and/or electronic component.

3. The device according to claim 1, comprising a plurality of electrical contact elements such that each of the two opposite faces of the electrical and/or electronic component comprises at least one of the electrical contact elements arranged in contact with the each of two opposite faces of the electrical and/or electronic component.

4. The device according to claim 1, in which the layer of material forming the front face of the device is transparent, the electrical and/or electronic component being capable of emitting and/or receiving at least one light flux through the front face of the device.

5. The device according to claim 1, in which the electrical and/or electronic component is in contact with the second layer of elastic material.

6. The device according to claim 1, in which each element based on an elastic material located on the side of the front face of the device is at least 80% transparent to wavelengths between about 300 nm and 1200 nm, and/or each element based on an elastic material located on the side of the back face of the device is at least 80% transparent to wavelengths more than about 1200 nm and/or have an optical reflection of at least 80% for wavelengths of between about 300 nm and 1200 nm.

7. The device according to claim 1, in which each elastic material is based on at least materials chosen from among polymers, silicone, rubber, polyurethane, elastomer or a material for which creep strain is less than about 10%, and/or also comprising an adhesive property.

8. The device according to claim 1, in which at least the electrical and/or electronic component, the electrical contact element, and the element based on an elastic material are placed in a closed, hermetically sealed, depressurised volume formed between the two layers of material.

9. The device according to claim 1, comprising:
a plurality of electrical and/or electronic components that are photovoltaic cells; and a plurality of electrical contact elements comprising strips of electrically conducting material placed in contact with the photovoltaic cells and electrically connecting the photovoltaic cells to each other, the device being a photovoltaic module.

10. The device according to claim 1, in which the electrical and/or electronic component is an electronic image sensor or an electronic display element.

11. A method for making an electrical and/or electronic device comprising:

making at least one electrical and/or electronic component comprising at least two opposite faces and at least one electrical contact element placed in contact with at least one of the two opposite faces of the electrical and/or electronic component;

making at least one element based on at least one elastic material in contact with a layer of material configured to form a front or back face of the device, forming a first layer of elastic material at least partially covering the layer of material, and at least one second layer based on at least one elastic material with an elastic stiffness less than the stiffness of the elastic material of the first layer, placed in contact with the first layer of elastic material;

encapsulating the electrical and/or electronic component between two layers of material forming the front and back faces of the device, each of the two opposite faces of the electrical and/or electronic component being placed facing one of the two layers of material; and in which Shore A hardness of the elastic materials of said element and of the second layer is <5.

* * * * *